US012805149B2

(12) United States Patent
Yun

(10) Patent No.: US 12,805,149 B2
(45) Date of Patent: Nov. 17, 2026

(54) DISPLAY DEVICE

(71) Applicant: LG Display Co., Ltd., Seoul (KR)

(72) Inventor: YeongHo Yun, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/379,626

(22) Filed: Nov. 4, 2025

(65) Prior Publication Data

US 2026/0068475 A1 Mar. 5, 2026

Related U.S. Application Data

(63) Continuation of application No. 18/739,238, filed on Jun. 10, 2024, now Pat. No. 12,490,626.

(30) Foreign Application Priority Data

Dec. 26, 2023 (KR) ........................ 10-2023-0191299

(51) Int. Cl.
*G06F 3/00* (2006.01)
*G06F 3/044* (2006.01)
(Continued)

(52) U.S. Cl.
CPC ........... *H10K 59/40* (2023.02); *G06F 3/0443* (2019.05); *H10K 59/122* (2023.02); (Continued)

(58) Field of Classification Search
CPC ......... G06F 2203/04111; G06F 3/0443; G09G 3/006; H10K 59/1213; H10K 59/122; (Continued)

(56) References Cited

U.S. PATENT DOCUMENTS 10,854,688 B2 12/2020 Hasegawa
11,250,745 B2 2/2022 Lee et al.
(Continued)

FOREIGN PATENT DOCUMENTS

CN 113035929 A 6/2021
CN 116322156 A 6/2023
(Continued)

OTHER PUBLICATIONS

Intellectual Property Office of the United Kingdom, Combined Search and Examination Report, United Kingdom Patent Application No. GB2407213.4, Feb. 11, 2025, 12 pages.
(Continued)

*Primary Examiner* — Insa Sadio
(74) *Attorney, Agent, or Firm* — Fenwick & West LLP

(57) ABSTRACT

A display device according to an exemplary embodiment of the present disclosure includes a substrate which includes a display area, an optical area disposed in the display area and including a through hole, and a non-display area, a first sensing line which is disposed in the non-display area and encloses an outer periphery of the display area, a second sensing line which is disposed inside more than the first sensing line and encloses an outer periphery of the display area and the through hole, and a plurality of metal patterns which is disposed along an outer periphery of the through hole below the second sensing line, and at least one of the plurality of metal patterns is electrically connected to the second sensing line. Accordingly, when a crack is generated in the non-display area or the optical area, a location where the crack is generated may be distinguished.

20 Claims, 8 Drawing Sheets

(51) Int. Cl.

| | |
|---|---|
| ***H10K 59/122*** | (2023.01) |
| ***H10K 59/131*** | (2023.01) |
| ***H10K 59/40*** | (2023.01) |
| ***H10K 59/65*** | (2023.01) |
| ***H10K 59/80*** | (2023.01) |

(52) U.S. Cl.
CPC ........... *H10K 59/131* (2023.02); *H10K 59/65* (2023.02); *H10K 59/873* (2023.02); *G06F 2203/04111* (2013.01)

(58) Field of Classification Search
CPC ...... H10K 59/131; H10K 59/40; H10K 59/65; H10K 59/873
See application file for complete search history.

(56) References Cited

U.S. PATENT DOCUMENTS

| | | | |
|---|---|---|---|
| 11,367,391 | B2 | 6/2022 | Zhou et al. |
| 11,645,959 | B2 | 5/2023 | Lee et al. |
| 11,844,237 | B2 | 12/2023 | Jung et al. |
| 12,193,311 | B2 | 1/2025 | Dai et al. |
| 12,262,622 | B2 | 3/2025 | Zhang et al. |
| 2020/0161406 | A1 | 5/2020 | Lee et al. |
| 2020/0235175 | A1 | 7/2020 | Hasegawa |
| 2021/0193751 | A1* | 6/2021 | Jang ...................... G06F 3/0412 |
| 2021/0335974 | A1 | 10/2021 | Zhou et al. |
| 2021/0359025 | A1 | 11/2021 | Jung et al. |
| 2022/0077193 | A1* | 3/2022 | Shin .................... G02F 1/13338 |
| 2022/0130302 | A1 | 4/2022 | Lee et al. |
| 2022/0310714 | A1 | 9/2022 | Zhang et al. |
| 2023/0030378 | A1 | 2/2023 | Zhang et al. |
| 2023/0134939 | A1 | 5/2023 | Zhang et al. |
| 2023/0146897 | A1 | 5/2023 | Han et al. |
| 2023/0200182 | A1 | 6/2023 | Bang |
| 2023/0252923 | A1 | 8/2023 | Lee et al. |
| 2024/0244929 | A1 | 7/2024 | Dai et al. |
| 2025/0081762 | A1 | 3/2025 | Shang et al. |

FOREIGN PATENT DOCUMENTS

| | | | |
|---|---|---|---|
| CN | 114930442 | B | 10/2023 |
| EP | 3761619 | A | 1/2021 |
| JP | 2020-115406 | A | 7/2020 |
| JP | 2021-117031 | A | 8/2021 |
| JP | 2021-518920 | A | 8/2021 |
| JP | 2021-179610 | A | 11/2021 |
| KR | 10-2020-0057139 | A | 5/2020 |
| KR | 10-2022-0094445 | A | 7/2022 |
| WO | WO 2022/057508 | A1 | 3/2022 |
| WO | WO 2023/000295 | A1 | 1/2023 |

OTHER PUBLICATIONS

Japan Patent Office, Office Action, Japanese Patent Application No. 2024-115353, May 1, 2025, eight pages.

Taiwan Intellectual Property Office, Office Action, Taiwanese Patent Application No. 113117681, Apr. 7, 2025, seven pages.

* cited by examiner

DISPLAY DEVICE

CROSS-REFERENCE TO RELATED APPLICATION

This application is a continuation application of U.S. patent application Ser. No. 18/739,238 filed on Jun. 10, 2024, which claims the priority of Republic of Korea Patent Application No. 10-2023-0191299 filed on Dec. 26, 2023, all of which are incorporated herein by reference in their entirety.

BACKGROUND

Field

The present disclosure relates to a display device, and more particularly, to a display device which senses a crack generated in an optical area in which a camera or a sensor is disposed.

Description of the Related Art

As it enters the information era, a field of a display device which visually expresses electrical information signals has been rapidly developed and studies are continued to improve performances of various display devices, such as a thin-thickness, a light weight, and low power consumption.

A representative display device may include a liquid crystal display device (LCD), a field emission display device (FED), an electro-wetting display device (EWD), and an organic light emitting display device (OLED).

An electroluminescent display device which is represented by an organic light emitting display device is a self-emitting display device so that a separate light source is not necessary, which is different from a liquid crystal display device. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, a contrast ratio (CR), it is expected to be utilized in various fields.

SUMMARY

An object to be achieved by the exemplary embodiment of the present disclosure is to provide a display device which senses a crack generated in a non-display area or an optical area.

An object to be achieved by another exemplary embodiment of the present disclosure is to provide a display device which distinguishes a location where a crack is generated when the crack is generated in a non-display area or an optical area.

Objects of the present disclosure are not limited to the above-mentioned objects, and other objects, which are not mentioned above, can be clearly understood by those skilled in the art from the following descriptions.

According to an aspect of the present disclosure, a display device includes: a substrate which includes a display area, an optical area disposed in the display area and including a through hole, and a non-display area enclosing the display area; a first sensing line which is disposed in the non-display area and encloses an outer periphery of the display area; a second sensing line which is disposed inside more than the first sensing line and encloses an outer periphery of the display area and the through hole; and a plurality of metal patterns which is disposed along an outer periphery of the through hole below the second sensing line, and at least one of the plurality of metal patterns is electrically connected to the second sensing line.

Other detailed matters of the exemplary embodiments are included in the detailed description and the drawings.

A display device according to an exemplary embodiment of the present disclosure may sense a crack generated in a non-display area or an optical area.

A display device according to an exemplary embodiment of the present disclosure may distinguish a location where a crack is generated when the crack is generated in a non-display area or an optical area.

Even though a crack is generated on the top of the encapsulation unit in an optical area including a through hole or a crack is generated in an insulating film disposed below a plurality of thin film transistors, a display device according to an exemplary embodiment of the present disclosure may sense the crack.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
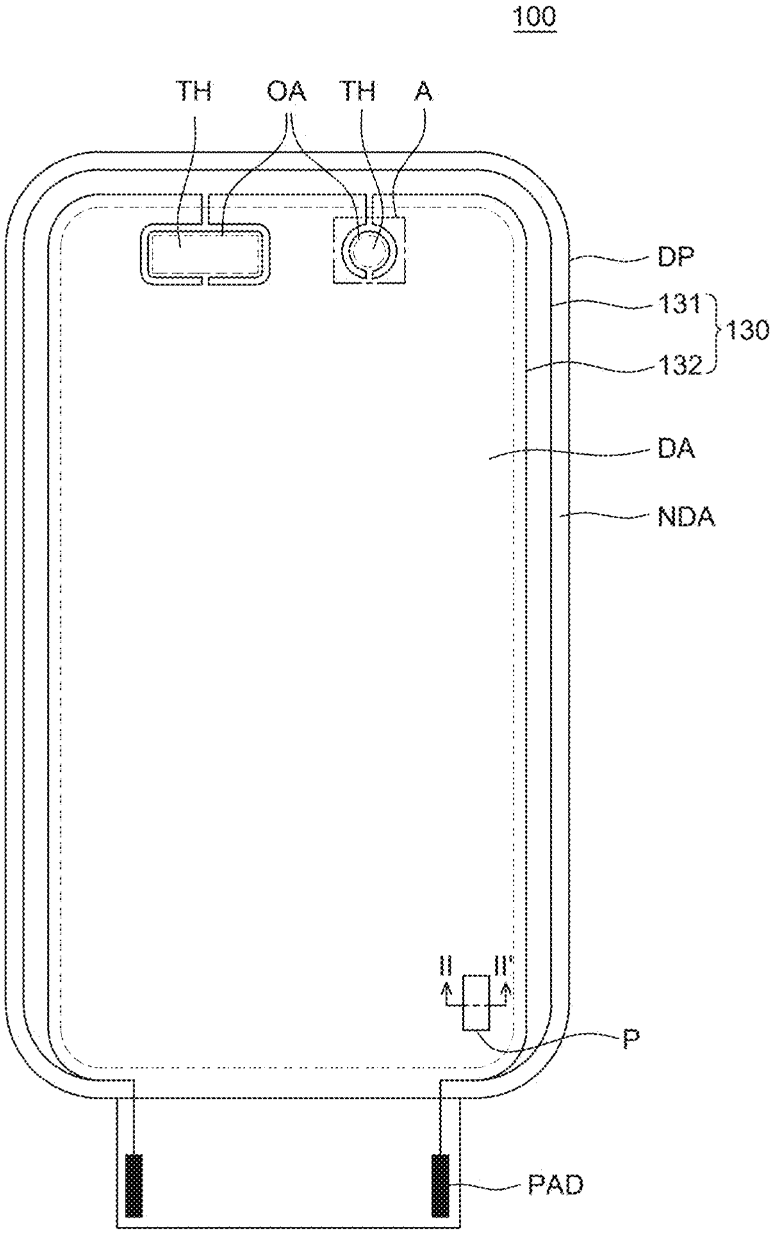
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “comprising” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly”.

When an element or layer is disposed “on” another element or layer, another layer or another element may be interposed directly on the other element or therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an exemplary embodiment of the present disclosure will be described in detail with reference to the drawings.

FIG. 1 is a plan view of a display device according to an exemplary embodiment of the present disclosure.

Referring to FIG. 1, a display device 100 of an exemplary embodiment of the present disclosure may include a circuit unit in which a display panel DP and a sensing pad PAD are disposed.

According to the exemplary embodiment of the present disclosure, the display panel DP may include a display area DA, an optical area OA which is disposed in the display area DA and includes a through hole TH, and a non-display area NDA which encloses the display area DA.

The display area DA is an area where images are displayed in the display panel DP.

In the display area DA, a plurality of pixels P and a circuit for driving the plurality of pixels P may be disposed. The plurality of pixels P are a minimum unit which configures the display area DA and a display element may be disposed in each of the plurality of pixels P. For example, an organic light emitting diode which includes an anode, an emission layer, and a cathode may be disposed in each of the plurality of pixels P, but it is not limited thereto. Further, a circuit for driving the plurality of pixels P may include a driving element and a wiring line. For example, the circuit may be configured by a thin film transistor, a storage capacitor, a gate line, and a data line, but is not limited thereto.

The optical area OA is disposed in the display area DA. In the optical area OA, the through hole TH formed by punching the display panel DP is located therein. The optical area OA may be an area for placing an optical electronic device, such as a camera, a flash, a speaker, and a photo sensor in the display area DA. In the display panel DP, the through hole TH is disposed in the display area DA to reduce a bezel area which is a non-display area NDA and maximizes (or at least increases) the display area DA. A product with a design which maximizes (or at least increases) the display area DA is aesthetically preferable by maximizing (or at least increasing) the user’s screen immersion.

As illustrated in FIG. 1, two through holes TH may be provided, but are not limited thereto and the through holes may be disposed in various forms. For example, one or two holes are disposed in the display area DA so that a camera is disposed in a first hole and a distance sensing sensor or a face recognition sensor, and a wide-angle camera may be disposed in a second hole.

The non-display area NDA is an area where no image is displayed.

The non-display area NDA is bent so as not to be seen from a front surface or blocked by a case (not illustrated) and is also referred to as a bezel area.

Even though in FIG. 1, it is illustrated that the non-display area NDA encloses a quadrangular display area DA, shapes and placements of the display area DA and the non-display area NDA are not limited to the example illustrated in FIG. 1. That is, the display area DA and the non-display area NDA may have shapes suitable for a design of an electronic device including the display device 100. For example, an exemplary shape of the display area DA may be a pentagon, a hexagon, a circle, or an oval.

In the non-display area NDA, various wiring lines and circuits for driving the organic light emitting diode of the display area DA may be disposed. For example, in the non-display area NDA, a link line which transmits signals to the plurality of sub pixels and circuits of the display area DA, a gate-in-panel (GIP) line, or a driving IC, such as a gate driver or a data driver, may be disposed, but it is not limited thereto.

In the non-display area NDA, a sensing line 130 for sensing a crack generated in the display panel DP may be disposed. For example, the sensing line 130 may include a first sensing line 131 which encloses an outer periphery of the display area DA and a second sensing line 132 which is disposed inside more than the first sensing line 131 and encloses an outer periphery of the display area DA and the through hole TH. The first sensing line 131 may sense a crack generated at an outer periphery of the display panel DP and the second sensing line 132 may sense a crack generated in the optical area OA.

One ends and the other ends of the first sensing line 131 and the second sensing line 132 are connected to the sensing pad PAD disposed in the non-display area NDA and the sensing pad PAD may receive a sensing signal output through the sensing line 130.

The sensing pad PAD may be located in a printed circuit board (PCB) connected to the non-display area NDA of the display panel DP, but is not limited thereto and may be directly mounted on the non-display area NDA of the display panel DP. A data driver which generates a data signal to drive the pixel P or a timing controller may be further located in the printed circuit board, but is not limited thereto. When the sensing pad PAD is located on the printed circuit board, the first sensing line 131 and the second sensing line 132 may extend to the printed circuit board.

The sensing pad PAD applies a sensing signal to the first sensing line 131 and receives a first sensing signal received thereby to inspect whether the first sensing line 131 is normal. The sensing pad PAD applies a sensing signal to the second sensing line 132 and receives a second sensing signal received thereby to inspect whether the second sensing line 132 is normal. The sensing pad PAD may sense a crack around the non-display area NDA and the optical area OA depending on whether the first sensing line 131 is normal and whether the second sensing line 132 is normal.

For example, when the display panel DP performs a lighting test (auto probe) for a final test, a predetermined level of power is applied to the sensing pad PAD from a separate device to compare an input value and an output value. A level of the resistance is confirmed by a difference of the output value from the input value and whether the sensing line is disconnected is conformed based on the level of the resistance. For example, when the crack is generated in the non-display area NDA of the display panel DP, a part or all of the sensing line 130 may be disconnected. For example, when a part of the sensing line 130 is disconnected, the resistance is gradually increased to weaken an output power. By doing this, it is confirmed whether the crack is generated in the display panel DP based on the resistance related characteristic, but the method for confirming whether the crack is generated is not limited thereto.

The display device 100 may further include various additional elements to generate various signals or drive the pixels P in the display area DA. The additional elements for driving the pixels P may include an inverter circuit, a multiplexer, or an electrostatic discharge (ESD) circuit. The display device 100 may further include an additional element associated with a function other than a function of driving a pixel P. For example, the display device 100 may further include additional elements which provide a touch sensing function, a user authentication function (for example, fingerprint recognition), a multilevel pressure sensing function, or a tactile feedback function. The above-mentioned additional elements may be located in an external circuit which is connected to the non-display area NDA and/or the connecting interface.

Here, a cross-sectional structure of the display area DA of the display device 100 will be described in more detail with reference to FIG. 2 together.

Figure 2:
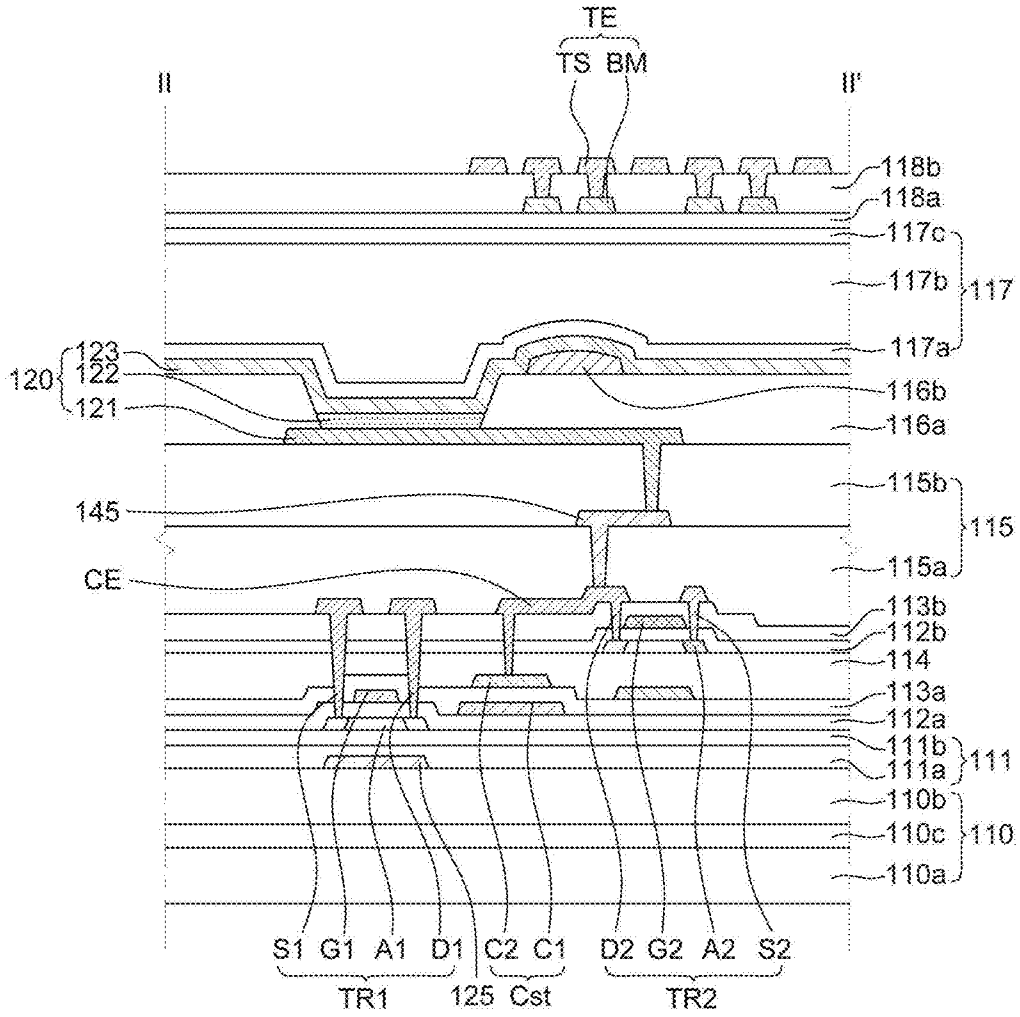
FIG. 2 is a cross-sectional view taken along the line II-II' of FIG. 1 according to an exemplary embodiment of the present disclosure.

FIG. 2 is a cross-sectional view illustrating a cross-sectional structure of one pixel P disposed in the display area DA according to an exemplary embodiment of the present disclosure.

A display device 100 according to an exemplary embodiment of the present disclosure may include a substrate 110, a first buffer layer 111, a first thin film transistor TR1, a second thin film transistor TR2, a first gate insulating layer 112*a*, a first interlayer insulating layer 113*a*, a second buffer layer 114, a second gate insulating layer 112*b*, a second interlayer insulating layer 113*b*, a connection electrode CE, a first planarization layer 115*a*, a second planarization layer 115*b*, an auxiliary electrode 145, a bank 116*a*, a spacer 116*b*, an anode 121, an emission layer 122, a cathode 123, an encapsulation unit 117, and a touch sensing unit.

The substrate 110 serves to support and protect components of a flexible display device disposed there above.

The substrate 110 is a component for supporting various components included in the display device 100 and may be formed of an insulating material. The substrate 110 may include a first substrate 110*a*, a second substrate 110*b*, and an interlayer insulating film 110*c*. The interlayer insulating film 110*c* may be disposed between the first substrate 110*a* and the second substrate 110*b*. As described above, the substrate 110 is configured by the first substrate 110*a*, the second substrate 110*b*, and the interlayer insulating film 110*c* to suppress the moisture permeation. For example, the first substrate 110*a* and the second substrate 110*b* may be polyimide (PI) substrates and the interlayer insulating film 110*c* may be formed of a single layer of silicon nitride $SiN_x$ or silicon oxide $SiO_x$ or a multi-layer thereof.

A light shielding layer 125 may be disposed on the substrate 110.

The first buffer layer 111 may be disposed on the substrate 110 and may cover the light shielding layer 125. Specifically, a multi-buffer layer 111*a* is disposed on the substrate 110 and covers the light shielding layer 125 and an active buffer layer 111*b* may be disposed on the multi-buffer layer 111*a*.

The multi-buffer layer 111*a* delays spreading of the moisture or oxygen permeating the substrate 110 and may include at least any one of silicon nitride $SiN_x$ and silicon oxide $SiO_x$.

The active buffer layer 111*b* protects a first active layer A1 and may block various types of defects introduced from the substrate 110. For example, the active buffer layer 111*b* may include at least any one of a-Si, silicon nitride $SiN_x$, and silicon oxide $SiO_x$.

The first thin film transistor TR1 may be disposed on the first buffer layer 111. The first thin film transistor TR1 may include the first active layer A1, a first gate electrode G1, a first source electrode S1, and a first drain electrode D1. Here, depending on the design of the pixel circuit, the first source electrode S1 may serve as a first drain electrode and the first drain electrode D1 may serve as a first source electrode.

The first active layer A1 may be disposed on the first buffer layer 111 so as to overlap the light shielding layer 125. The first active layer A1 may include amorphous silicon or polycrystalline silicon. For example, the first active layer A1 may include a low-temperature polycrystalline silicon (LTPS). For example, the polycrystalline silicon material has a high mobility (100 $cm^2/Vs$ or higher) so that energy power consumption is low and reliability is excellent. Therefore, the polycrystalline silicon material may be applied to a gate driver for driving elements which drive thin film transistors for a display element and/or a multiplexer (MUX) and also applied as the first active layer A1 of a driving thin film transistor of the display device 100 according to the exemplary embodiment, but is not limited thereto. For example, the polycrystalline silicon material may also be applied as a second active layer A2 of the switching thin film transistor according to the characteristic of the display device 100. An amorphous silicon (a-Si) material is deposited on the first buffer layer 111 and a dehydrogenation process and a crystallization process are performed to form polycrystalline silicon and the polycrystalline silicon is patterned to form the first active layer A1. Here, the first active layer A1 may include a first channel region in which a channel is formed when the first thin film transistor TR1 is driven and a first source region and a first drain region on both sides of the first channel region. The first source region refers to a part of the first active layer A1 which is connected to the first source electrode S1 and the first drain region refers to a part of the first active layer A1 which is connected to the first drain electrode D1. For example, the first source region and the first drain region may be configured by ion-doping (impurity doping) of the first active layer A1. The first source region and the first drain region may be generated by doping ions into the polycrystalline silicon material and the first channel region may refer to a part in which the ions are not doped, but the polycrystalline silicon material remains.

The first gate insulating layer 112*a* may be disposed on the first active layer A1. The first gate insulating layer 112*a* may be configured by a single layer of silicon nitride $SiN_x$ or silicon oxide $SiO_x$ or a multi-layer thereof. In the first gate insulating layer 112*a*, a contact hole through which the first source electrode S1 and the first drain electrode D1 of the first thin film transistor TR1 are connected to the first source region and the first drain region of the first active layer A1 of the first thin film transistor TR1, respectively, may be formed.

The first gate electrode G1 of the first thin film transistor TR1 and a first capacitor electrode C1 of the storage capacitor Cst may be disposed on the first gate insulating layer 112*a*.

At this time, the first gate electrode G1 and the first capacitor electrode C1 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The first gate electrode G1 may be formed on the first gate insulating layer 112*a* so as to overlap the first channel region of the first active layer A1 of the first thin film transistor TR1.

The first capacitor electrode C1 may be omitted based on a driving characteristic of the display device 100 and a structure and a type of the thin film transistor. The first gate electrode G1 and the first capacitor electrode C1 may be formed by the same process. Further, the first gate electrode G1 and the first capacitor electrode C1 may be formed of the same material on the same layer.

The first interlayer insulating layer 113*a* may be disposed above the first gate insulating layer 112*a*, the first gate electrode G1, and the first capacitor electrode C1. The first interlayer insulating layer 113*a* may be configured by a single layer of silicon nitride $SiN_x$ or silicon oxide $SiO_x$ or a multi-layer thereof. Further, in the first interlayer insulating layer 113*a*, a contact hole for exposing the first source region and the first drain region of the first active layer A1 of the first thin film transistor TR1 may be formed.

A second capacitor electrode C2 of the storage capacitor Cst may be disposed on the first interlayer insulating layer 113*a*. The second capacitor electrode C2 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The second capacitor electrode C2 may be formed on the first interlayer insulating layer 113*a* so as to overlap the first capacitor electrode C1. Further, the second capacitor electrode C2 may be formed of the same material as the first capacitor electrode C1. The second capacitor electrode C2 may be omitted based on a driving characteristic of the display device 100 and a structure and a type of the thin film transistor.

The second buffer layer 114 may be disposed on the first interlayer insulating layer 113*a* and the second capacitor electrode C2. The second buffer layer 114 may be configured by a single layer of silicon nitride $SiN_x$ or silicon oxide $SiO_x$ or a multi-layer thereof. A contact hole for exposing the first source region and the first drain region of the first active layer A1 of the first thin film transistor TR1 may be formed in the second buffer layer 114. Further, in the second buffer layer 114, a contact hole for exposing the second capacitor electrode C2 of the storage capacitor Cst may be formed.

The second buffer layer 114 may be formed by a multi-layer, but is not limited thereto.

The second active layer A2 of the second thin film transistor TR2 may be disposed on the second buffer layer 114. Here, the second thin film transistor TR2 may include the second active layer A2, the second gate insulating layer 112*b*, a second gate electrode G2, a second source electrode S2, and a second drain electrode D2. Further, the first thin film transistor TR1 and the second thin film transistor TR2 may be disposed on different layers. The second thin film transistor TR2 may be disposed on the first thin film transistor TR1. However, the present disclosure is not limited thereto. Here, depending on the design of the pixel circuit, the second source electrode S2 may serve as a drain electrode and the second drain electrode D2 may serve as a source electrode.

Further, the second active layer A2 may include a second channel region in which a channel is formed when the second thin film transistor TR2 is driven and a second source region and a second drain region on both sides of the second channel region. The second source region refers to a part of the second active layer A2 which is connected to the second source electrode S2 and the second drain region refers to a part of the second active layer A2 which is connected to the second drain electrode D2.

The second active layer A2 may be formed of an oxide semiconductor. The oxide semiconductor material has a large band gap as compared with a silicon material so that electrons may not jump over the band gap in an off state. Therefore, the oxide semiconductor material has a low off-current. Therefore, the thin film transistor including an active layer which is formed of an oxide semiconductor is suitable for a switching thin film transistor which maintains on-time to be short and off-time to be long, but is not limited thereto. Depending on the characteristic of the display device 100, the oxide semiconductor may be applied as a driving thin film transistor. Further, due to the small off-current, a magnitude of an auxiliary capacitance may be reduced so that the oxide semiconductor may be appropriate for a high resolution display element. For example, the second active layer A2 may be formed of metal oxide and for example, may be formed of various metal oxide such as indium-gallium-zinc-oxide (IGZO). Here, the description was made under assumption that the second active layer 2 of the second thin film transistor TR2 is configured by IGZO, among various metal oxides, but it is not limited thereto. Therefore, the active layer may be formed of another metal oxide such as indium-zinc-oxide (IZO), indium-gallium-tin-oxide (IGTO), or indium-gallium-oxide (IGO), rather than IGZO.

The second active layer A2 may be formed by depositing the metal oxide on the second buffer layer 114, performing a heat treatment for stabilization, and then patterning the metal oxide.

The second gate insulating layer 112*b* may be disposed on the entire substrate 110 including the second active layer A2. For example, the second gate insulating layer 112*b* may be configured by a single layer of silicon nitride $SiN_x$ or silicon oxide $SiO_x$ or a multi-layer thereof.

The second gate electrode G2 may be disposed on the second gate insulating layer 112*b*.

The second gate electrode 134 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

For example, a metal material is formed on the second gate insulating layer 112*b*, a photoresist pattern is formed on the metal material, and then the metal material is wet-etched using the photoresist pattern as a mask to form the second gate electrode G2. As a wet etchant for etching the metal material, a material which selectively etches molybdenum (Mo), copper (Cu), titanium (Ti), aluminum (Al), chrome (Cr), gold (Au), nickel (Ni), and neodymium (Nd) or an alloy thereof which configures the metal material but does not etch the insulating material may be used.

The second interlayer insulating layer 113*b* may be disposed on the second gate insulating layer 112*b* and the second gate electrode G2. A contact hole for exposing the first active layer A1 of the first thin film transistor TR1 and the second active layer A2 of the second thin film transistor TR2 may be formed in the second interlayer insulating layer 113*b*. For example, a contact hole for exposing the first source region and the first drain region of the first active layer A1 of the first thin film transistor TR1 may be formed in the second interlayer insulating layer 113*b*. A contact hole for exposing the second source region and the second drain region of the second active layer A2 of the second thin film transistor TR2 may be formed in the second interlayer insulating layer 113*b*.

The second interlayer insulating layer 113*b* may be configured as a single layer of silicon nitride $SiN_x$ or silicon oxide $SiO_x$ or a multi-layer thereof.

The connection electrode CE, the first source electrode S1 and the first drain electrode D1 of the first thin film transistor TR1 and the second source electrode S2 and the second drain electrode D2 of the second thin film transistor TR2 may be disposed on the second interlayer insulating layer 113*b*.

The connection electrode CE may be electrically connected to the second drain electrode D2 of the second thin film transistor TR2. Further, the connection electrode CE may be electrically connected to the second capacitor electrode C2 of the storage capacitor Cst through the contact holes formed in the second buffer layer 114, the second gate insulating layer 112*b*, and the second interlayer insulating layer 113*b*. That is, the connection electrode CE may serve to electrically connect the second capacitor electrode C2 of the storage capacitor Cst and the second drain electrode D2 of the second thin film transistor TR2 to each other.

Here, the first source electrode S1 and the first drain electrode D1 of the first thin film transistor TR1 may be connected to the first active layer A1 of the first thin film transistor TR1 through the contact holes formed in the first gate insulating layer 112*a*, the first interlayer insulating layer 113*a*, the second buffer layer 114, the second gate insulating layer 112*b*, and the second interlayer insulating layer 113*b*.

The second source electrode S2 and the second drain electrode D2 of the second thin film transistor TR2 may be connected to the second active layer A2 through the contact holes formed in the second gate insulating layer 112*b* and the second interlayer insulating layer 113*b*.

The connection electrode CE, the first source electrode S1 and the first drain electrode D1 of the first thin film transistor TR1 and the second source electrode S2 and the second drain electrode D2 of the second thin film transistor TR2 may be formed of the same material by the same process.

For example, the connection electrode CE, the first source electrode S1 and the first drain electrode D1 of the first thin film transistor TR1 and the second source electrode S2 and the second drain electrode D2 of the second thin film transistor TR2 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. For example, the connection electrode CE, the first source electrode S1 and the first drain electrode D1 of the first thin film transistor TR1 and the second source electrode S2 and the second drain electrode D2 of the second thin film transistor TR2 may be formed of a triple-layered structure of titanium (Ti)/aluminum (Al)/titanium (Ti), but are not limited thereto.

The connection electrode CE may be integrally formed to be connected to the second drain electrode D2 of the second thin film transistor TR2, but is not limited thereto.

The first planarization layer 115*a* may be disposed on the connection electrode CE, the first source electrode S1 and the first drain electrode D1 of the first thin film transistor TR1, the second source electrode S2 and the second drain electrode D2 of the second thin film transistor TR2, and the second interlayer insulating layer 113*b*.

The first planarization layer 115*a* may be an organic layer which planarizes and protects upper portions of the first thin film transistor TR1 and the second thin film transistor TR2. For example, the first planarization layer 115*a* may be formed of an organic material such as acryl resin, epoxy resin, phenolic resin, polyamide resin, or polyimide resin.

The auxiliary electrode 145 may be disposed on the first planarization layer 115*a*. The auxiliary electrode 145 may be connected to the second drain electrode D2 of the second thin film transistor TR2 through the contact hole of the first planarization layer 115*a*. The auxiliary electrode 145 may serve to electrically connect the second thin film transistor TR2 and the anode 121 with each other. Further, the auxiliary electrode 145 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The auxiliary electrode 145 may be formed of the same material as the second source electrode S2 and the second drain electrode D2 of the second thin film transistor TR2.

The second planarization layer 115*b* may be disposed above the auxiliary electrode 145 and the first planarization layer 115*a*. Further, although it is not shown in the drawings, a third planarization layer may be disposed above the second planarization layer 115*b*. For example, the second planarization layer 115*b* and the third planarization layer may be formed of an organic material, such as acryl resin, epoxy resin, phenolic resin, polyamide resin, or polyimide resin.

The light emitting diode 120 may be disposed on the second planarization layer 115*b*.

The anode 121 may be disposed on the second planarization layer 115*b*. At this time, the anode 121 may be electrically connected to the auxiliary electrode 145 through the contact hole provided in the second planarization layer 115*b* or the third planarization layer. The anode 121 may be formed of a metallic material.

When the display device 100 is a top emission type in which light emitted from the light emitting diode 120 is emitted above the substrate 110, the anode 121 may further include a transparent conductive layer and a reflective layer on the transparent conductive layer. The transparent conductive layer may be formed of transparent conductive oxide such as ITO or IZO and the reflective layer may be formed of silver (Ag), aluminum (Al), gold (Au), molybdenum (Mo), tungsten (W), chrome (Cr), or an alloy thereof.

The bank 116*a* may be disposed while covering the anode 121. The bank 116*a* may be a pixel-defining film exposing an emission area of each sub pixel. A part of the bank 116*a* corresponding to an emission area of the sub pixel may be open. A part of the anode 121 may be exposed through the open part of the bank 116_a_ (hereinafter, referred to as an open area). At this time, the bank 116_a_ may be formed of an inorganic insulating material, such as silicon nitride $SiN_x$ or silicon oxide $SiO_x$, or an organic insulating material, such as benzocyclobutene-based resin, acrylic-based resin or imide-based resin or an opaque material (e.g. black material) to prevent (or at least reduce) optical interference between adjacent sub pixels, in this case, the bank 116_a_ may include a light blocking material made of at least one of color pigment, organic black, and carbon, but is not limited thereto. The spacer 116_b_ may be further disposed on the bank 116_a_.

The emission layer 122 may be disposed in the open area of the bank 116_a_. Therefore, the emission layer 122 may be disposed on the anode 121 exposed through the open area of the bank 116_a_.

The cathode 123 may be disposed to cover the emission layer 122 and the bank 116_a_.

The light emitting diode 120 may be formed by the anode 121, the emission layer 122, and the cathode 123. The emission layer 122 may include a plurality of organic films.

The encapsulation unit 117 may be located on the above-described light emitting diode 120.

The encapsulation unit 117 may have a single layer structure or a multi-layered structure. For example, the encapsulation unit 117 may include a first encapsulation layer 117_a_, a second encapsulation layer 117_b_, and a third encapsulation layer 117_c_.

At this time, the first encapsulation layer 117_a_ and the third encapsulation layer 117_c_ may be configured by inorganic films and the second encapsulation layer 117_b_ may be configured by an organic film. Among the first encapsulation layer 117_a_, the second encapsulation layer 117_b_, and the third encapsulation layer 117_c_, the second encapsulation layer 117_b_ is thickest and serves as a planarization layer.

The first encapsulation layer 117_a_ is disposed on the cathode 123 and may be disposed to be most adjacent to the light emitting diode 120. The first encapsulation layer 117_a_ may be formed of an inorganic insulating material on which low-temperature deposition may be performed. For example, the first encapsulation layer 117_a_ may be configured by silicon nitride $SiN_x$, silicon oxide $SiO_x$, silicon oxynitride SiON, or aluminum oxide $Al_2O_3$. The first encapsulation layer 117_a_ is deposited under a low temperature atmosphere so that during the deposition process, the damage of the emission layer 122 including an organic material which is vulnerable to the high temperature atmosphere may be suppressed.

The second encapsulation layer 117_b_ may be formed to have a smaller area than that of the first encapsulation layer 117_a_. In this case, the second encapsulation layer 117_b_ may be formed to expose both ends of the first encapsulation layer 117_a_. The second encapsulation layer 117_b_ may serve as a buffer to alleviate stress between the layers due to bending of the flexible display device and to enhance planarization performance.

For example, the second encapsulation layer 117_b_ may be formed of an organic insulating material, such as acrylic resin, epoxy resin, polyimide, polyethylene, or silicon oxy carbon (SiOC). For example, the second encapsulation layer 117_b_ may be formed by an inkjet method, but is not limited thereto.

The third encapsulation layer 117_c_ may be formed above the substrate on which the second encapsulation layer 117_b_ may be formed so as to cover upper surfaces and side surfaces of the second encapsulation layer 117_b_ and the first encapsulation layer 117_a_. At this time, the third encapsulation layer 117_c_ may minimize, reduce, or block the permeation of external moisture or oxygen into the first encapsulation layer 117_a_ and the second encapsulation layer 117_b_. For example, the third encapsulation layer 117_c_ may be configured by an inorganic insulating material, such as silicon nitride $SiN_x$, silicon oxide $SiO_x$, silicon oxynitride SiON, or aluminum oxide $Al_2O_3$.

The touch sensing layer may be disposed on the encapsulation unit 117.

For example, a touch buffer layer 118_a_ is disposed above the third encapsulation layer 117_c_ and a touch electrode TE may be disposed on the touch buffer layer 118_a_.

The touch electrode TE may include a touch sensor electrode TS and a touch bridge electrode BM located on different layers. A touch interlayer insulating layer 118_b_ may be disposed between the touch sensor electrode TS and the touch bridge electrode BM.

The touch buffer layer 118_a_ and the touch interlayer insulating layer 118_b_ may be disposed to remove a step of a location where the touch electrode TE is disposed and be electrically insulated.

In the meantime, even though it is not illustrated, a polarization layer may be disposed on the touch sensing layer.

The polarization layer suppresses reflection of external light on the display area DA of the substrate 110. When the display device 100 is used at the outside, external natural light enters to be reflected by a reflective layer included in the anode 121 of the light emitting diode 120 or reflected by an electrode which is formed of a metal and disposed below the light emitting diode 120. Therefore, the image of the display device 100 may not be visibly recognized due to the light reflected as described above. The polarization layer polarizes the light entering from the outside to a specific direction and suppresses the reflected light from being emitted to the outside of the display device 100.

Even though it is not illustrated, a cover glass may be bonded onto the polarization layer through an adhesive layer. The adhesive layer serves to adhere the components of the display device 100 to each other, and for example, may be formed using an optically clear display adhesive, such as a pressure sensitive adhesive, an optical clear adhesive (OCR) or an optical clear resin (OCR), but is not limited thereto.

The cover glass protects the component of the display device 100 from the external and suppresses damages such as a scratch.

Figure 3:
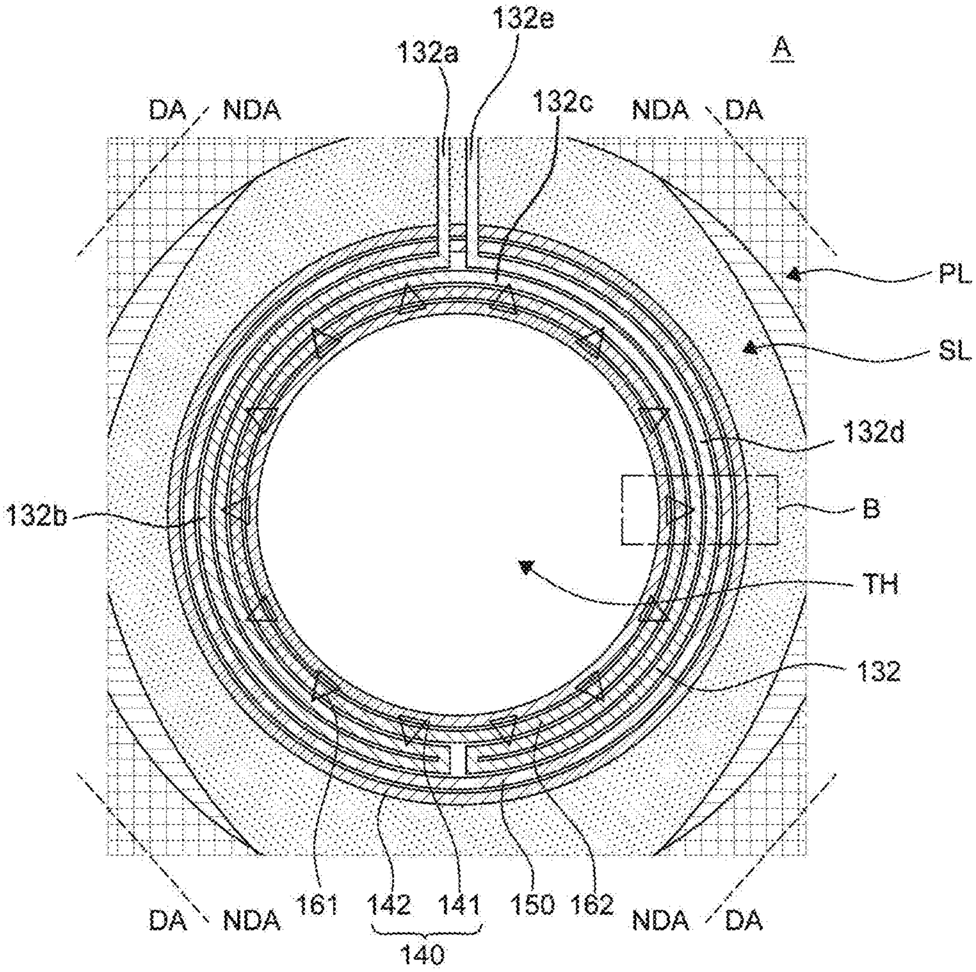
FIG. 3 is an enlarged plan view of an area A of FIG. 1 according to an exemplary embodiment of the present disclosure.
Figure 4:
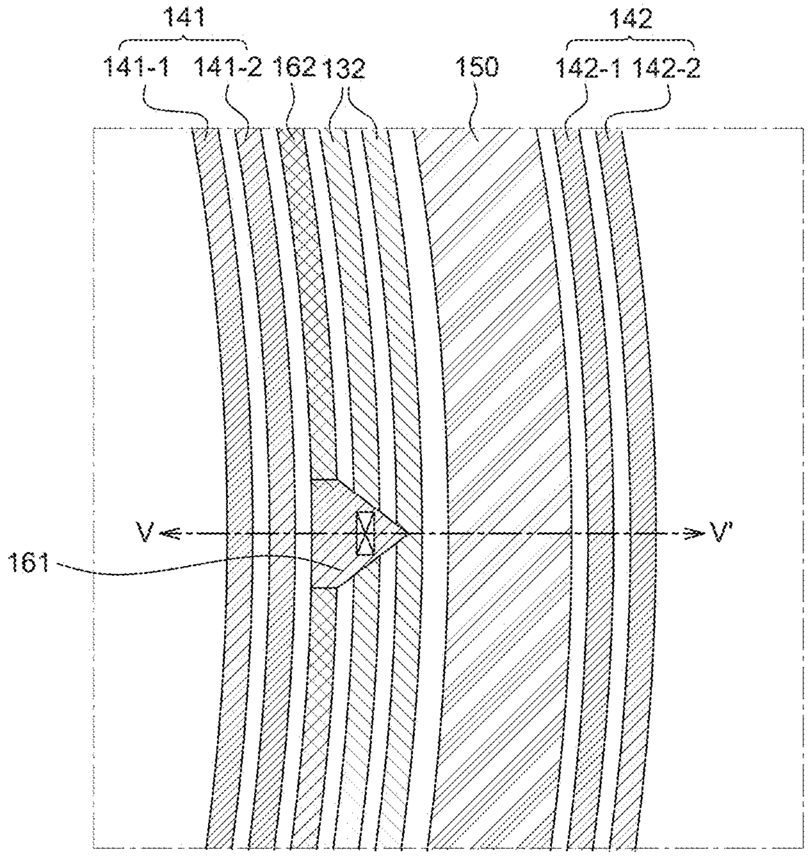
FIG. 4 is an enlarged plan view of an area B of FIG. 3 according to an exemplary embodiment of the present disclosure.
Figure 5:
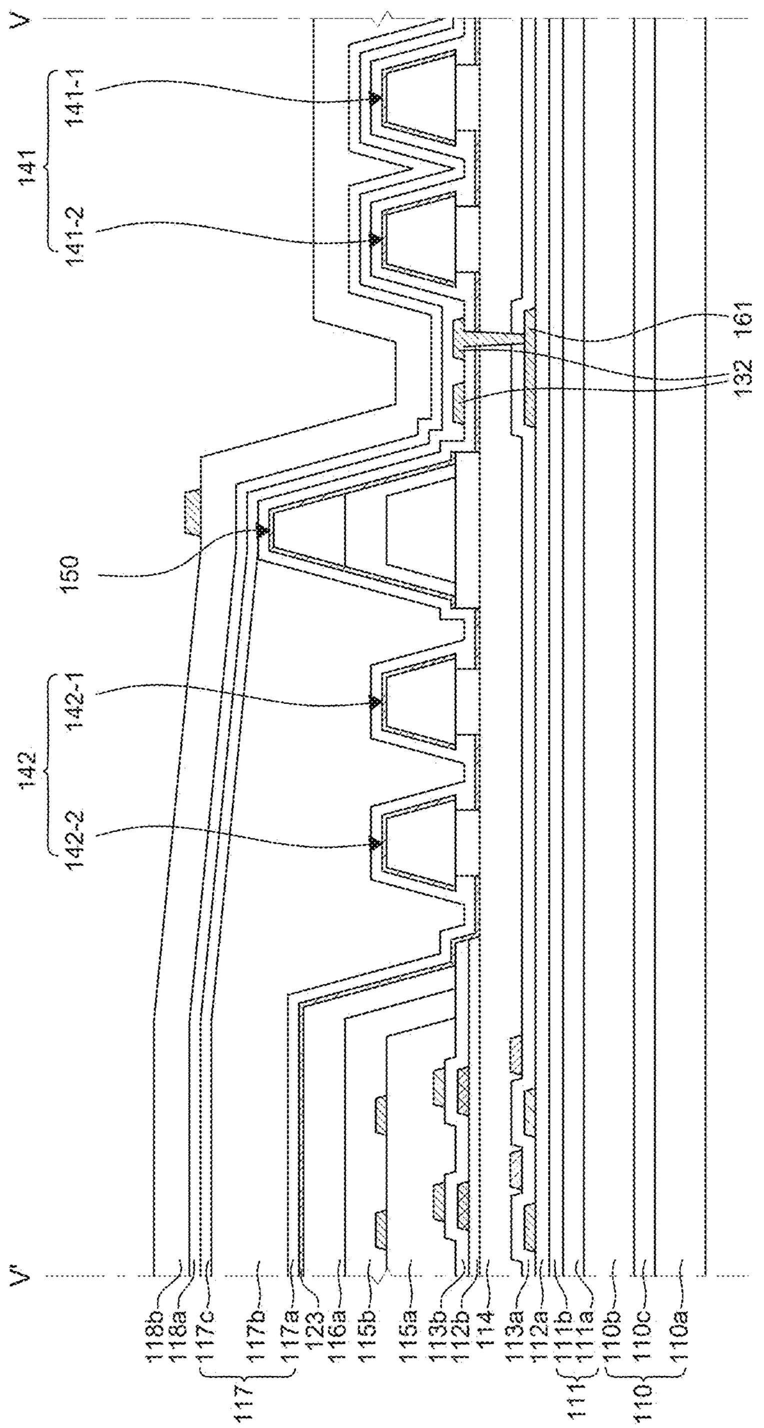
FIG. 5 is a cross-sectional view taken along the line V-V' of FIG. 4 according to an exemplary embodiment of the present disclosure.

FIG. 3 is a plan view of enlarging an area A corresponding to the optical area OA of FIG. 1. FIG. 4 is an enlarged plan view of an area B of FIG. 3. FIG. 5 is a cross-sectional view taken along the line V-V' of the area B of FIG. 4.

Referring to FIG. 3, the optical area OA includes a through hole TH for placing an optical electronic device at a center and a camera module or a sensor is disposed in the optical area. The optical area OA may include all areas in which a circular or oval through hole TH, an adjacent dam 150, and a connection suppression unit 140 are disposed. The through hole TH may be removed by laser in a step of completing the panel. The non-display area NDA may be located between the through hole TH and the display area DA and a high potential power line PL and a gate line SL may be disposed therein. As the optical area OA is disposed, the light emitting diode 120 and the pixel circuit in the corresponding area are removed. However, the light emitting diode 120 and the pixel circuit which are disposed in upper, lower, left, and right sides of the optical area OA need to be electrically connected. To this end, the high potential power line PL and the gate line SL may be disposed to be connected in upper, lower, left, and right sides in the non-display area NDA adjacent to the optical area OA by detouring the through hole TH.

Referring to FIG. 3, the connection suppression unit 140 is configured by a first suppression unit 141 and a second suppression unit 142 and the dam 150 may be disposed between the first suppression unit 141 and the second suppression unit 142. In the exemplary embodiment of the present disclosure, one dam 150 is illustrated, but is not limited thereto and an additional dam may also be disposed depending on the placement of the space. Referring to FIG. 3, the first suppression unit 141, the dam 150, the second sensing line 132, a metal line 162, and the second suppression unit 142 are sequentially disposed with respect to the through hole TH.

Generally, the dam 150 is provided to suppress the second encapsulation layer 117*b* which is a part of the encapsulation unit 117 at an outer peripheral unit of the display panel DP from flowing to an end of the outer peripheral unit of the display panel DP. By doing this, the adhesiveness of the upper substrate and the lower substrate which configures the display panel DP is maintained.

The dam 150 of the optical area OA is also formed to suppress the invasion or leakage of the second encapsulation layer 117*b* of the encapsulation unit 117 for protecting the light emitting diode 120 to the optical area OA.

The first suppression unit 141 and the second suppression unit 142 may be disposed to protect the light emitting diode 120 of the display area from moisture or oxygen which may flow from the through hole TH. The cathode 123 of the light emitting diode 120 is deposited on the front surface of the display panel DP and is also uniformly deposited in the optical area OA. The moisture and oxygen may be transmitted to the light emitting diode 120 of the display area DA through the cathode 123. In order to suppress this, the cathode 123 may be partially disconnected by the first suppression unit 141 and the second suppression unit 142. In the present specification, two suppression units are illustrated, but are not limited thereto.

The first suppression unit 141 includes a first structure 141-1 and a second structure 141-2 and the second suppression unit 142 includes a third structure 142-1 and a fourth structure 142-2. Referring to FIGS. 3 and 4, it is understood that the first suppression unit 141, the dam 150, and the second suppression unit 142 are formed in a closed loop around the through hole TH. The first suppression unit 141, the dam 150, and the second suppression unit 142 are formed in a closed loop. This is because if any part is open, the moisture and oxygen may permeate the display area DA from the outside or on the contrary, the second encapsulation layer 117*b* may overflow from the inside into the optical area OA and further into the through hole TH. Referring to FIG. 4, each of the first suppression unit 141 and the second suppression unit 142 is configured by two structures, but is not limited thereto. For example, one or three structures may be configured, but the present disclosure is not limited thereto.

Referring to FIGS. 3, 4, and 5, the second sensing line 132 may be disposed between the first suppression unit 141 and the dam 150. That is, the second sensing line 132 may include a first branch portion 132*a*, a first outer portion 132*b*, an inner portion 132*c*, a second outer portion 132*d*, and a second branch portion 132*e*, and the inner portion 132*c* is disposed between the through hole TH and the first outer portion 132*b* or the second outer portion 132*d*. Further, the first branch portion 132*a* and the second branch portion 132*e* are disposed to overlap the dam 150.

The through hole TH may be formed in the optical area OA of the display panel DP to dispose the camera or the optical sensor. In order to form the through hole TH, a precision cutting process using a laser may be performed on the substrate 110 in the optical area OA of the display panel DP.

The laser may be irradiated in a circular or oval shape in accordance with the shape of the optical area OA and all the areas above the substrate 110 including the substrate 110 may be removed by irradiating the laser. However, an actual optical area OA and the laser irradiating area may be different and for example, the laser irradiating area in the optical area OA may be an area of 100 μm from inside. When the laser irradiating area and the optical area OA are different as described above, the insulating layer in the optical area OA is not damaged by the laser irradiation.

As the laser, picosecond laser or femtosecond laser may be used, but is not limited thereto. A laser uses stimulated emission light by amplifying the light generated by applying energy to a specific material and has characteristics similar to radio waves and has directivity to monochromatic light, so it is used for communication, medical, and industrial purposes. When the laser is used, a pattern is formed in a desired part or a specific part may be easily removed. The laser forms or removes a pattern using energy and when the energy of the laser is irradiated on a subject, the thermal energy melts the subject to form a pattern. As a time to irradiate the laser is increased, thermal effect which is transmitted adjacent to a part in which the pattern is formed may be generated. Due to this thermal effect, the heat is accumulated in the vicinity of the laser irradiating area of the subject so that a surrounding area larger than a set pattern may be burned or deformed by the heat. If an area in which the laser is irradiate overlaps or is adjacent to the insulating film, due to this characteristic of the laser, the thermal energy of the laser may deform the insulating film. The insulating film is deformed to generate cracks and the cracks propagate through the insulating film so that separation occurs or permeation of the moisture or oxygen may be generated thereby. For example, all the insulating films may be removed at a distance of approximately 100 μm from the laser irradiating location to suppress the deformation or the separation of the insulating films, such as the multi-buffer layer 111*a*, the active buffer layer 111*b*, the first gate insulating layer 112*a*, the first interlayer insulating layer 113*a*, the second buffer layer 114, the second gate insulating layer 112*b*, and the second interlayer insulating layer 113*b*.

The crack generated when the substrate 110 is cut by the laser may be transmitted through inflexible, hard, inorganic insulating layers. Alternatively, when the camera or sensor is assembled in the through hole TH formed by the laser, the crack may occur due to the interruption. The crack generated at this time also propagates through the inorganic insulating layer. When the crack generated in the through hole TH propagates through the inorganic insulating layer, a line defect or a growing dark spot (GDS) defect may occur.

In order to suppress this problem, according to the exemplary embodiment of the present disclosure, when a crack occurs in the vicinity of the through hole TH, a second sensing line 132 which senses the crack may be disposed.

According to the exemplary embodiment of the present disclosure, the second sensing line 132 may be formed to confirm the enlargement of the crack which is generated on a cut surface of the through hole TH.

Referring to FIGS. 2, 4, and 5 together, the second sensing line 132 according to the exemplary embodiment of the present disclosure may be disposed on the same layer as a plurality of touch sensor electrodes TS or a plurality of touch bridge electrodes BM disposed on the encapsulation unit 117. Accordingly, the second sensing line 132 may easily sense the crack generated on the encapsulation unit 117, but may hardly sense the crack which is generated in the inorganic insulating layer below the encapsulation unit 117 or is transmitted through the inorganic insulating layer.

Therefore, according to the exemplary embodiment of the present disclosure, a plurality of metal patterns 161 which overlap the second sensing line 132 below the second sensing line 132 along an outer periphery of the through hole TH may be further disposed. At least one of the plurality of metal patterns 161 may be electrically connected to the second sensing line 132. The plurality of metal patterns 161 may be formed in a polygonal shape, such as a triangle, a rectangle, or a pentagon, but the shape of the plurality of metal patterns 161 is not limited thereto.

For example, when a crack is generated in or a generated crack is transmitted to an inorganic insulating layer, such as the multi-buffer layer 111*a*, the active buffer layer 111*b*, the first gate insulating layer 112*a*, the first interlayer insulating layer 113*a*, the second buffer layer 114, the second gate insulating layer 112*b*, and the second interlayer insulating layer 113*b*, a part of the second sensing line 132 connected to the plurality of metal patterns 161 is disconnected and resistance is increased. Therefore, the crack which is generated in or transmitted to the inorganic insulating layer of the optical area OA may be precisely sensed.

According to the exemplary embodiment of the present disclosure, a metal line 162 which connects the plurality of metal patterns 161 may be further included. For example, the metal line 162 may be disposed on the same layer with the same material as the gate line or the second gate electrode G2. The metal line 162 connects the plurality of metal patterns 161 so that even though a crack is generated in an area between the plurality of metal patterns 161, the crack may be precisely sensed by the metal line 162.

Referring to FIGS. 4 and 5 together, the first suppression unit 141 may include the first structure 141-1 and the second structure 141-2, as described above with reference FIG. 4. The first structure 141-1 and the second structure 141-2 may be configured to have two-stage structure with an upper portion and a lower portion to disconnect the cathode 123 which may become a moisture permeation path from the area in which the through hole TH is disposed. Further, an under-cut structure may be formed on an upper side surface. Specifically, the upper portions of the first structure 141-1 and the second structure 141-2 are disposed to have a trapezoidal cross-section which is regularly tapered, and the lower portions are disposed to have a rectangular cross-section which is regularly tapered or has a constant height close to vertical. Therefore, there may be a difference in a width on a bottom surface of the upper portion and a top surface of the lower portion at which the upper portion and the lower portion meet. The top surface of the lower portion is formed to be narrower than the bottom surface of the upper portion, an undercut structure in which a part of the bottom surface of the upper portion is exposed may occur. By doing this, the cathode 123 deposited on the front surface of the display panel DP may be disconnected by the undercut structure of an upper side surfaces of the first structure 141-1 and the second structure 141-2 as described above.

The first structure 141-1 and the second structure 141-2 which configure the first suppression unit 141 may be formed of organic material and an inorganic material. For example, the upper portions of the first structure 141-1 and the second structure 141-2 may be formed by the same material as the first planarization layer 115*a* or the second planarization layer 115*b*, but are not limited thereto. Further, the lower portions of the first structure 141-1 and the second structure 141-2 may be formed by the same material as the second interlayer insulating layer 113*b*, but are not limited thereto.

The second suppression unit 142 may include the third structure 142-1 and the fourth structure 142-2. The third structure 142-1 and the fourth structure 142-2 which configure the second suppression unit 142 may be formed with the double stage structure including an upper portion and a lower portion, like the first structure 141-1 and the second structure 141-2. The second encapsulation layer 117*b* disposed on the second suppression unit 142 makes it difficult for moisture or oxygen to permeate the upper portion. In order to block the path mainly penetrating through the side portion where the through hole TH or the first suppression unit 141 is disposed, an undercut structure may be formed on the upper side surface, like the first suppression unit 141. The first suppression unit 141 and the second suppression unit 142 are disposed so that the moisture or the oxygen permeating into the light emitting diode 120 of the display area DA in the optical area OA through the cathode 123 may be suppressed.

The third structure 142-1 and the fourth structure 142-2 which configure the second suppression unit 142 may also be formed of organic material and an inorganic material. For example, the upper portions of the third structure 142-1 and the fourth structure 142-2 may be formed by the same material as the first planarization layer 115*a* or the second planarization layer 115*b*, but are not limited thereto. Further, the lower portions of the third structure 142-1 and the fourth structure 142-2 may be formed by the same material as the second interlayer insulating layer 113*b*, but are not limited thereto.

As illustrated in FIG. 5, the dam 150 may be formed by laminating the second planarization layer 115*b*, the bank 116*a*, and the spacer 116*b*, but is not limited thereto and further includes the first planarization layer 115*a* or another layer.

The second sensing line 132 disposed between the second structure 141-2 of the first suppression unit 141 and the dam 150 may be disposed on the same layer as the plurality of touch sensor electrodes TS or the plurality of touch bridge electrodes BM.

The second sensing line 132 may be electrically connected to the plurality of metal patterns 161 disposed on the same layer as the second gate electrode G2 of the display panel DP by a contact hole which exposes a part of the plurality of metal patterns 161, on the plurality of metal patterns 161.

A line width of the second sensing line 132 is not limited, but may be selected in consideration of a size of a structure of the first suppression unit 141 and a crack sensing sensitivity. A design width of the second sensing line 132 may be smaller than that of the structure of the first suppression unit 141 which suppresses the permeation of the moisture and oxygen. The second sensing line 132 may be disposed to be adjacent to the second suppression unit 142. However, in order to detect whether a crack is generated at an initial stage, it is preferable to dispose the second sensing line between the first suppression unit 141 and the dam 150.

Figure 6:
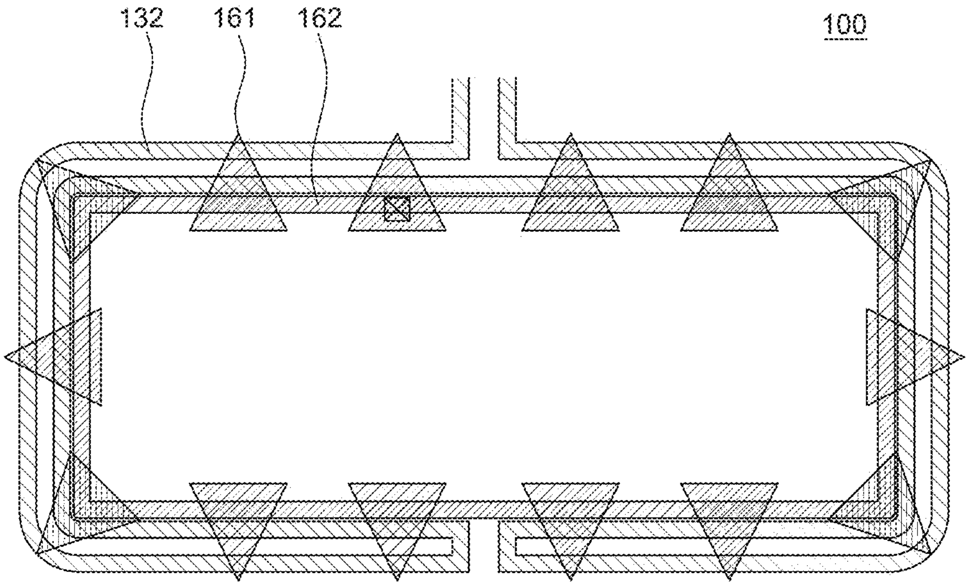
FIG. 6 is a plan view of a display device according to an exemplary embodiment of the present disclosure.

FIG. 6 is a plan view of an optical area according to an exemplary embodiment of the present disclosure. The plan view of FIG. 6 is to explain the contact of the plurality of metal patterns 161 and the second sensing line 132 in the optical area OA and for the convenience of description, a redundant description other than the contact of the plurality of metal patterns 161 and the second sensing line 132 will be omitted.

According to another feature of the present specification, the plurality of metal patterns 161 may be connected to the second sensing line 132 through a contact hole which exposes a part of the plurality of metal patterns 161 on the plurality of metal patterns 161.

According to an exemplary embodiment of the present disclosure, even though only any one of the plurality of metal patterns 161 which is connected by the plurality of metal lines 162 is connected to the second sensing line 132, when a crack is generated in or a generated crack is transmitted to an inorganic insulating layer, such as the multi-buffer layer 111*a*, the active buffer layer 111*b*, the first gate insulating layer 112*a*, the first interlayer insulating layer 113*a*, the second buffer layer 114, the second gate insulating layer 112*b*, and the second interlayer insulating layer 113*b*, a part of the second sensing line 132 connected to the plurality of metal patterns 161 is disconnected and a resistance is increased. Therefore, the crack which is generated in or transmitted to the inorganic insulating layer of the optical area OA may be precisely sensed.

Hereinafter, an optical area OA of a display device according to another exemplary embodiment of the present disclosure will be described in more detail with reference to FIG. 7.

Figure 7:
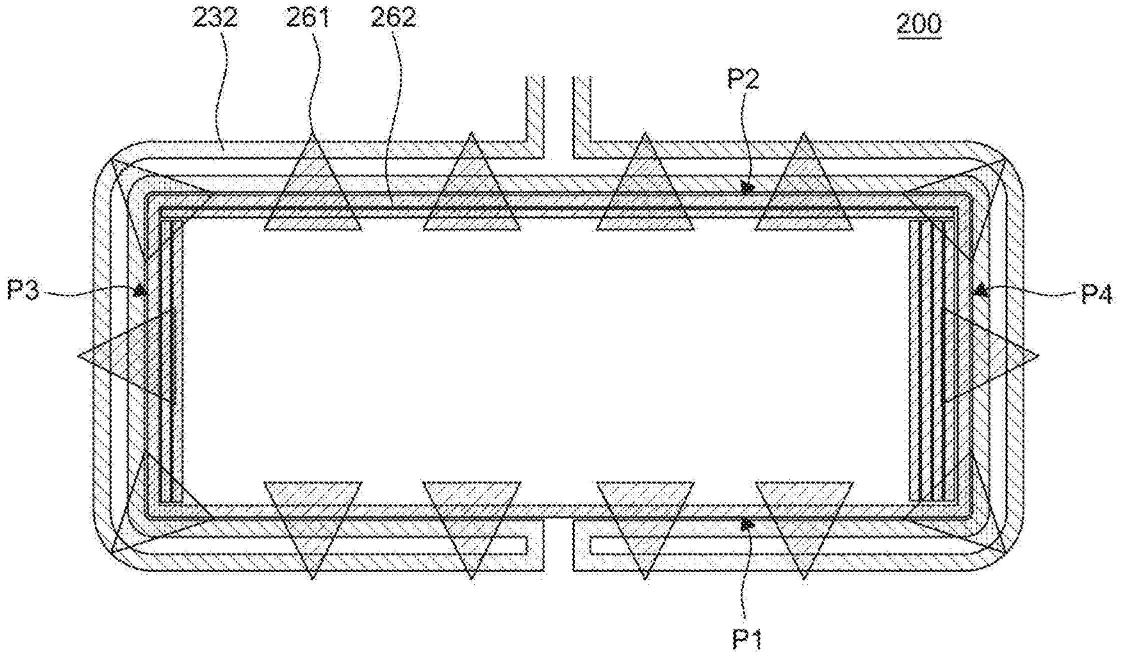
FIG. 7 is a plan view of a display device according to another exemplary embodiment of the present disclosure.

FIG. 7 is a cross-sectional view of a display device 200 according to another exemplary embodiment of the present disclosure. In the plan view of FIG. 7, configurations other than the metal line which connects the plurality of metal patterns in the optical area OA are substantially the same. Therefore, for the convenience of description, a redundant description other than the plurality of metal patterns and metal lines, such as a second sensing line 232, will be omitted.

In the display device 200 according to another exemplary embodiment of the present disclosure, a metal line 262 which connects the plurality of metal patterns 261 is configured by a first part P1, a second part P2, a third part P3, and a fourth part P4. The second part P2 is opposite to the first part P1, the third part P3 is connected to one end of the first part P1 and one end of the second part P2, and the fourth part P4 is opposite to the third part P3 and is connected to another end of the first part P1 and another part of the second part P2. At least one of the first part P1, the second part P2, the third part P3, and the fourth part P4 of the metal lines 262 is formed by a plurality of metal lines.

Specifically, the first part P1 is formed by one metal line, the second part P2 may be formed by two metal lines, the third part P3 is formed by three metal lines, and the fourth part P4 is formed by five metal lines. For example, the plurality of metal lines 262 are connected in parallel or a metal line which is formed of the same material as the metal line 262 may be additionally disposed to be parallel on the same layer.

According to another exemplary embodiment of the present disclosure, the number of metal lines 262 varies depending on the location so that the first part P1, the second part P2, the third part P3, and the fourth part P4 of the metal line 262 may have different resistance values. Accordingly, when the metal line 262 which connects the plurality of metal patterns 261 is disconnected due to the crack, the resistance increase degree may vary depending on the number of disconnected cracks. Accordingly, when the number of metal lines 262 varies depending on the location, the location where the crack is generated may be accurately sensed.

Hereinafter, an optical area OA of a display device 300 according to still another exemplary embodiment of the present disclosure will be described in more detail with reference to FIG. 8.

Figure 8:
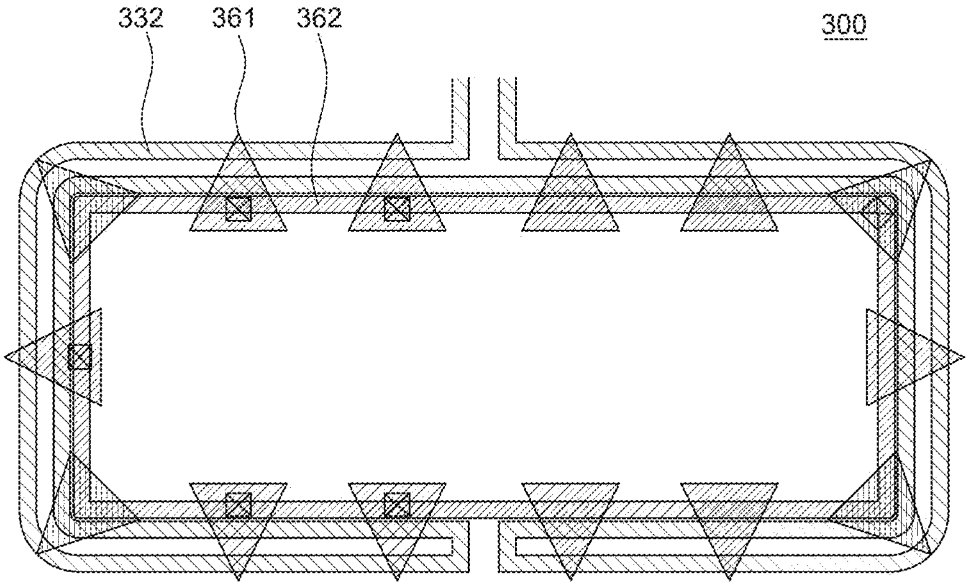
FIG. 8 is a plan view of a display device according to still another exemplary embodiment of the present disclosure.

FIG. 8 is a plan view of the display device 300 according to still another exemplary embodiment of the present disclosure. In the plan view of FIG. 8, configurations other than contact of a plurality of metal patterns 361 and a second sensing line 332 in the optical area OA are substantially the same. Therefore, for the convenience of description, a redundant description other than the contact of the plurality of metal patterns 361 and the second sensing line 332 will be omitted.

In the display device 300 according to still another exemplary embodiment of the present specification, the plurality of metal patterns 361 may be connected to the second sensing line 332 through a contact hole which exposes a part of the plurality of metal patterns 361 on the plurality of metal patterns 361. For example, the contact hole is disposed in at least two or more of the plurality of metal patterns 361 and the second sensing line 332 may be electrically connected to at least two or more of the plurality of metal patterns 361 through the contact hole.

According to still another exemplary embodiment of the present disclosure, when at least two or more of the plurality of metal patterns 361 connected by the plurality of metal lines 362, and more desirably, all the plurality of metal patterns 361 connected by the plurality of metal lines 362 are connected to the second sensing line 332, if a crack is generated in or a generated crack is transmitted to an inorganic insulating layer, such as the multi-buffer layer 111*a*, the active buffer layer 111*b*, the first gate insulating layer 112*a*, the first interlayer insulating layer 113*a*, the second buffer layer 114, the second gate insulating layer 112*b*, and the second interlayer insulating layer 113*b*, a part of the second sensing line 332 connected to the plurality of metal patterns 361 is disconnected and a resistance may be increased. Therefore, the crack which is generated in or transmitted to the inorganic insulating layer of the optical area OA may be precisely sensed.

The exemplary embodiments of the present disclosure can also be described as follows:

According to an aspect of the present disclosure, a display comprising a substrate which includes a display area, an optical area disposed in the display area and including a through hole, and a non-display area enclosing the display area, a first sensing line which is disposed in the non-display area and encloses an outer periphery of the display area, a second sensing line which is disposed inside more than the first sensing line and encloses an outer periphery of the display area and the through hole, and a plurality of metal patterns which is disposed along an outer periphery of the through hole below the second sensing line, at least one of the plurality of metal patterns is electrically connected to the second sensing line.

The display device may further include a metal line which connects the plurality of metal patterns.

A metal line which connects the plurality of metal patterns is configured by a first part, a second part which is opposite to the first part, a third part which is connected to one end of the first part and one end of the second part, and a fourth part which is opposite to the third part and is connected to the other end of the first part and the other end of the second part, and at least one of the first part, the second part, the third part, and the fourth part of the metal line may be formed by the plurality of metal lines.

The second part may be formed by two metal lines, the third part may be formed by three metal lines, and the fourth part may be formed by four metal lines.

The first part, the second part, the third part, and the fourth part of the metal line may have different resistance values.

The display area includes a plurality of thin film transistors disposed on the substrate, a plurality of light emitting diodes disposed on the plurality of thin film transistors, an encapsulation unit which covers the plurality of light emitting diodes, and a plurality of touch electrodes and a plurality of touch bridge electrodes disposed on the encapsulation unit, and the second sensing line may be disposed on the same layer as the plurality of touch electrodes or the plurality of touch bridge electrodes.

The first sensing line may be disposed on the same layer as the second sensing line.

The plurality of thin film transistors include a first thin film transistor which is disposed on the substrate of the display area and includes a first active layer including silicon, a first gate electrode, a first source electrode, and a first drain electrode, and a second thin film transistor which is disposed on the first thin film transistor and includes a second active layer including oxide, a second gate electrode, a second source electrode, and a second drain electrode, and the plurality of metal patterns may be formed on the same layer as the first gate electrode.

The plurality of metal patterns may be connected to the second sensing line by a contact hole which exposes a part of the plurality of metal patterns on the plurality of metal patterns.

The contact hole is disposed in at least two or more of the plurality of metal patterns and the second sensing line may be electrically connected to at least two or more of the plurality of metal patterns through the contact hole.

The display device may further include at least one dam which is disposed on the substrate and encloses the through hole, and at least one connection suppression unit which is disposed on the substrate and is disposed to be closer to the through hole than at least one dam, the second sensing line may be disposed between the dam and the connection suppression unit.

The display device may further include an optical electronic device which is disposed to overlap the optical area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but are not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
- a substrate comprising a display area, an optical area in the display area and including at least one through hole, and a non-display area enclosing the display area; and
- a first sensing line enclosing an outer periphery of the at least one through hole,
- wherein the display area includes a light emitting diode including an emission layer and a bank including a black material, the emission layer of the light emitting diode being disposed in an open area of the bank,
- wherein the optical area includes at least one dam on the substrate, the at least one dam enclosing the at least one through hole and including the black material of the bank.

2. The display device according to claim 1, wherein the at least one through hole includes a first through hole and a second through hole, the first through hole and the second through hole having different shape.

3. The display device according to claim 1, wherein the first sensing line is disposed between the at least one through hole and the at least one dam.

4. The display device according to claim 1, further comprising:
- a plurality of metal patterns along the outer periphery of the through hole below the first sensing line,
- wherein at least one of the plurality of metal patterns is electrically connected to the first sensing line.

5. The display device according to claim 4, wherein the plurality of metal patterns are connected to the first sensing line by a contact hole that exposes a part of the plurality of metal patterns.

6. The display device according to claim 5, wherein the contact hole is disposed to expose at least two of the plurality of metal patterns, and the first sensing line is electrically connected to the at least two of the plurality of metal patterns through the contact hole.

7. The display device according to claim 4, further comprising:
- a metal line that connects the plurality of metal patterns.

8. The display device according to claim 4, further comprising:
- a metal line that connects the plurality of metal patterns, the metal line comprising:
  - a first part;
  - a second part opposite to the first part;
  - a third part connected to one end of the first part and one end of the second part; and
  - a fourth part opposite to the third part and connected to another end of the first part and another end of the second part, and
  - wherein at least one of the first part, the second part, the third part, and the fourth part of the metal line includes a plurality of metal lines.

9. The display device according to claim 8, wherein the second part comprises two metal lines, the third part comprises three metal lines, and the fourth part comprises four metal lines.

10. The display device according to claim 9, wherein the first part, the second part, the third part, and the fourth part of the metal line have different resistance values.

11. The display device according to claim 1, wherein the first sensing line includes a first branch portion, a first outer portion, an inner portion, a second outer portion, and a second branch portion, and the inner portion is disposed between the at least one through hole and the first outer portion or the second outer portion.

12. The display device according to claim 1, further comprising:
- a second sensing line in the non-display area,
- wherein the second sensing line enclosing an outer periphery of the display area.

13. The display device according to claim 1, further comprising:

at least one connection suppression unit on the substrate, the at least one connection suppression unit closer to the at least one through hole than the at least one dam, wherein the first sensing line is between the at least one dam and the at least one connection suppression unit.

14. The display device according to claim 1, further comprising:

a first thin film transistor on the substrate of the display area, the first thin film transistor comprising a first active layer including silicon, a first gate electrode, a first source electrode, and a first drain electrode; and a second thin film transistor on the first thin film transistor, the second thin film transistor comprising a second active layer including oxide, a second gate electrode, a second source electrode, and a second drain electrode.

15. The display device according to claim 14, further comprising:

a storage capacitor on the substrate, wherein the storage capacitor including a first capacitor electrode being on a same layer as the first gate electrode, the second capacitor electrode on the first capacitor electrode, and an interlayer insulating layer between the first capacitor electrode and the second capacitor electrode.

16. The display device according to claim 14, further comprising:

an encapsulation unit on the light emitting diode, wherein a part of the encapsulation unit overlaps a part of the at least one dam of the optical area.

17. The display device according to claim 16, further comprising:

a plurality of touch sensor electrodes and a plurality of touch bridge electrodes on the encapsulation unit.

18. The display device according to claim 17, wherein the first sensing line is disposed on a same layer as the plurality of touch sensor electrodes or the plurality of touch bridge electrodes.

19. The display device according to claim 17, further comprising:

a touch buffer layer disposed between the encapsulation unit and the plurality of touch sensor electrodes or between the encapsulation unit and the plurality of touch bridge electrodes, and a touch interlayer insulating layer disposed between the plurality of touch sensor electrodes and the plurality of touch bridge electrodes.

20. The display device according to claim 18, further comprising:

a second sensing line in the non-display area, the second sensing line enclosing an outer periphery of the display area, and wherein the first sensing line is on a same layer as the second sensing line.

* * * * *